(12) United States Patent
Sha et al.

(10) Patent No.: US 10,768,532 B2
(45) Date of Patent: Sep. 8, 2020

(54) CO-OPTIMIZATION OF LITHOGRAPHIC AND ETCHING PROCESSES WITH COMPLEMENTARY POST EXPOSURE BAKE BY LASER ANNEALING

(71) Applicant: International Business Machines Corporation, Armonk, NY (US)

(72) Inventors: Jing Sha, White Plains, FL (US); Ekmini Anuja De Silva, Slingerlands, NY (US); Nelson Felix, Slingerlands, NY (US); Derren Dunn, Sandy Hook, CT (US)

(73) Assignee: International Business Machines Corporation, Armonk, NY (US)

( * ) Notice: Subject to any disclaimer, the term of this patent is extended or adjusted under 35 U.S.C. 154(b) by 131 days.

(21) Appl. No.: 15/980,501

(22) Filed: May 15, 2018

(65) Prior Publication Data
US 2019/0354022 A1 Nov. 21, 2019

(51) Int. Cl.
*G03F 7/20* (2006.01)
*G03F 1/44* (2012.01)
*G03F 7/16* (2006.01)

(52) U.S. Cl.
CPC .............. *G03F 7/7055* (2013.01); *G03F 1/44* (2013.01); *G03F 7/168* (2013.01); *G03F 7/202* (2013.01); *G03F 7/70625* (2013.01)

(58) Field of Classification Search
CPC . G03F 1/44; G03F 7/168; G03F 7/202; G03F 7/7055; G03F 7/70625
(Continued)

(56) References Cited

U.S. PATENT DOCUMENTS

| 5,124,927 A | 6/1992 | Hopewell et al. |
| 5,516,608 A | 5/1996 | Hobbs et al. |

(Continued)

OTHER PUBLICATIONS

Jung et al., "Kinetic Rates of Thermal Transformations and Diffusion in Polymer Systems Measured during Sub-millisecond Laser-Induced Heating", vol. 6, No. 7, pp. 5830-5836 2012.
(Continued)

*Primary Examiner* — Chun Cao
(74) *Attorney, Agent, or Firm* — Fleit Intellectual Property Law; Thomas S. Grzesik

(57) ABSTRACT

A method of co-optimizing lithographic and etching processes for semiconductor fabrication. The method includes determining a first set of locations for a first complementary laser annealing to be performed on. The first complementary laser annealing is performed at the first set of locations on at least a first semiconductor wafer of a plurality of semiconductor wafers. The first complementary laser annealing is performed before or after a first post-exposure baking process for the at least first semiconductor wafer. After an etching process has been performed on at least the first semiconductor wafer, a second set of locations is determined for a second complementary laser annealing to be performed on. The second complementary laser annealing is performed at the second set of locations on at least a second semiconductor wafer of the plurality of semiconductor wafers. The second complementary laser annealing is performed before or after a second post-exposure baking process.

20 Claims, 3 Drawing Sheets

(58) Field of Classification Search
USPC .......................................................... 700/121
See application file for complete search history.

(56) References Cited

U.S. PATENT DOCUMENTS

| | | | |
|---|---|---|---|
| 7,012,031 | B2 | 3/2006 | Choi et al. |
| 7,187,796 | B1 | 3/2007 | Phan et al. |
| 7,334,202 | B1 | 2/2008 | Singh et al. |
| 7,429,532 | B2 * | 9/2008 | Ramaswamy ............ G03F 1/54 |
| | | | 257/E21.035 |
| 7,999,910 | B2 | 8/2011 | Chen et al. |
| 8,120,748 | B2 | 2/2012 | Geh et al. |
| 2004/0007325 | A1 * | 1/2004 | Pan .................... H01L 21/67161 |
| | | | 156/345.1 |
| 2006/0141376 | A1 | 6/2006 | Levy et al. |
| 2006/0154479 | A1 | 7/2006 | Lee |
| 2013/0087783 | A1 * | 4/2013 | Wang .................... H01L 21/316 |
| | | | 257/43 |
| 2015/0331328 | A1 * | 11/2015 | Zhang ................. G03F 7/70066 |
| | | | 355/67 |
| 2017/0207214 | A1 * | 7/2017 | Or-Bach ............. H01L 21/6835 |
| 2018/0024072 | A1 * | 1/2018 | Han ........................ G01N 21/41 |
| | | | 435/7.1 |
| 2018/0348636 | A1 * | 12/2018 | De Silva .................... G03F 7/11 |
| 2019/0015929 | A1 * | 1/2019 | Cui ........................ H01L 21/268 |

OTHER PUBLICATIONS

Maslow et al., "Co-optimization of lithographic and patterning processes for improved EPE performance" Proc. of SPIE vol. 10149 2017.

* cited by examiner

CO-OPTIMIZATION OF LITHOGRAPHIC AND ETCHING PROCESSES WITH COMPLEMENTARY POST EXPOSURE BAKE BY LASER ANNEALING

BACKGROUND OF THE INVENTION

The present disclosure generally relates to the field of semiconductors, and more particularly relates to optimizing lithographic and etching process for semiconductor device fabrication.

Lithography, in the context of building integrated circuits (ICs) such as microprocessors and memory chips, is a highly specialized printing process used to put detailed patterns onto silicon wafers. An image containing the desired pattern is projected onto the wafer through a mask defining the pattern. Prior to light projection through the mask, the wafer is coated with a thin layer of photosensitive material called "resist". For positive-tone photoresists, the bright parts of the image pattern cause chemical reactions that result in the resist material becoming more soluble, and thus dissolve away in a developer liquid; the dark portions of the image remaining insoluble. For negative-tone resists, the exposed (bright image parts) photoresist remains after development. After development, the resist forms a stenciled pattern across the wafer surface which accurately matches the desired mask pattern. Finally, the pattern is permanently transferred onto the wafer surface in an etching process wherein, for example, a chemical etchant is used to etch the portions of the wafer surface not protected by resist.

SUMMARY OF THE INVENTION

In one embodiment, a method of co-optimizing lithographic and etching processes for semiconductor fabrication is provided. The method comprises determining a first set of locations for a first complementary laser annealing to be performed on at least a first semiconductor wafer of a plurality of semiconductor wafers. The first complementary laser annealing is performed at the first set of locations on at least the first semiconductor wafer after a first post-exposure baking process has been performed on at least the first semiconductor wafer. A second set of locations for a second complementary laser annealing to be performed on at least a second semiconductor wafer of the plurality of semiconductor wafers is determined after an etching process has been performed on at least the first semiconductor wafer. The second complementary laser annealing is performed at the second set of locations on at least the second semiconductor wafer after a second post-exposure baking process has been performed on at least the second semiconductor wafer.

In another embodiment, an additional method of co-optimizing lithographic and etching processes for semiconductor fabrication is provided. The method comprises determining a first set of locations for a first complementary laser annealing to be performed on at least a first semiconductor wafer of a plurality of semiconductor wafers. The first complementary laser annealing is performed at the first set of locations on at least the first semiconductor wafer prior to a first post-exposure baking process being performed on at least the first semiconductor wafer. A second set of locations for a second complementary laser annealing to be performed on at least a second semiconductor wafer of the plurality of semiconductor layers is determined after an etching process has been performed on at least the first semiconductor wafer. The second complementary laser annealing is performed at the second set of locations on at least the second semiconductor wafer prior to a second post-exposure baking process being performed on the third semiconductor wafer.

In a further embodiment, a system for co-optimizing lithographic and etching processes for semiconductor fabrication is provided. The system comprises memory, one or more processors, and at least one controller. The at least one controller is configured to perform a method. The method comprises determining a first set of locations for a first complementary laser annealing to be performed on at least a first semiconductor wafer of a plurality of semiconductor wafers. The first complementary laser annealing is performed at the first set of locations on at least the first semiconductor wafer either before or after a first post-exposure baking process for at least the first semiconductor wafer. A second set of locations for a second complementary laser annealing to be performed on at least a second semiconductor wafer of the plurality of semiconductor wafers is determined after an etching process has been performed on at least the first semiconductor wafer. The second complementary laser annealing is performed at the second set of locations on at least the second semiconductor wafer either before or after a second post-exposure baking process for at least second semiconductor wafer.

BRIEF DESCRIPTION OF THE DRAWINGS

The accompanying figures where like reference numerals refer to identical or functionally similar elements throughout the separate views, and which together with the detailed description below are incorporated in and form part of the specification, serve to further illustrate various embodiments and to explain various principles and advantages all in accordance with the present invention, in which.

DETAILED DESCRIPTION

As required, detailed embodiments are disclosed herein; however, it is to be understood that the disclosed embodiments are merely examples and that the systems and methods described below can be embodied in various forms. Therefore, specific structural and functional details disclosed herein are not to be interpreted as limiting, but merely as a basis for the claims and as a representative basis for teaching one skilled in the art to variously employ the present subject matter in virtually any appropriately detailed structure and function. Further, the terms and phrases used herein are not intended to be limiting, but rather, to provide an understandable description of the concepts.

As semiconductor manufacturing technology node goes beyond 7 nm, edge placement error (EPE) and critical dimension uniformity (CDU) issues become more difficult to overcome. EPE refers to the difference between the edges of intended and printed features of a semiconductor device. If features are not placed at their intended locations a misalignment of these features, or an EPE occurs. Critical dimension (CD) refers to the feature size that a lithography system prints, and CDU is the uniformity of the patterned dimension.

Conventional optimization methods of lithographic and etching processes usually attempt to address only intra-field (of lithographic exposure) variation, but not inter-field variation. In addition, current solutions take up extra time and resources on high-cost tools and/or tool re-configuration. Embodiments of the present invention, on the other hand, perform co-optimizing lithographic and etching processes using localized heating by laser annealing to complement POR (process of record) hot plate PEB (post etch bake) to achieve global and local CDU on wafers. Complementary laser PEB is easy to incorporate into current process flows due to no extra time or resources on high-cost (exposure) tools and no need to re-configure current tools for advanced optimization capabilities. Laser PEB provides precise control of PEB temperature, duration, and location, and thus allows for countering different global and local effects. These flexibilities are not generally available with conventional hot plate only PEB. Also, the heat treatment area provided by the laser PEB of one or more embodiments may range from laser beam spot size (on the order of laser wavelength) to whole wafer (by scanning laser beam in an overlapping approach). This generally cannot be achieved by conventional hot plate only PEB.

Figure 1:
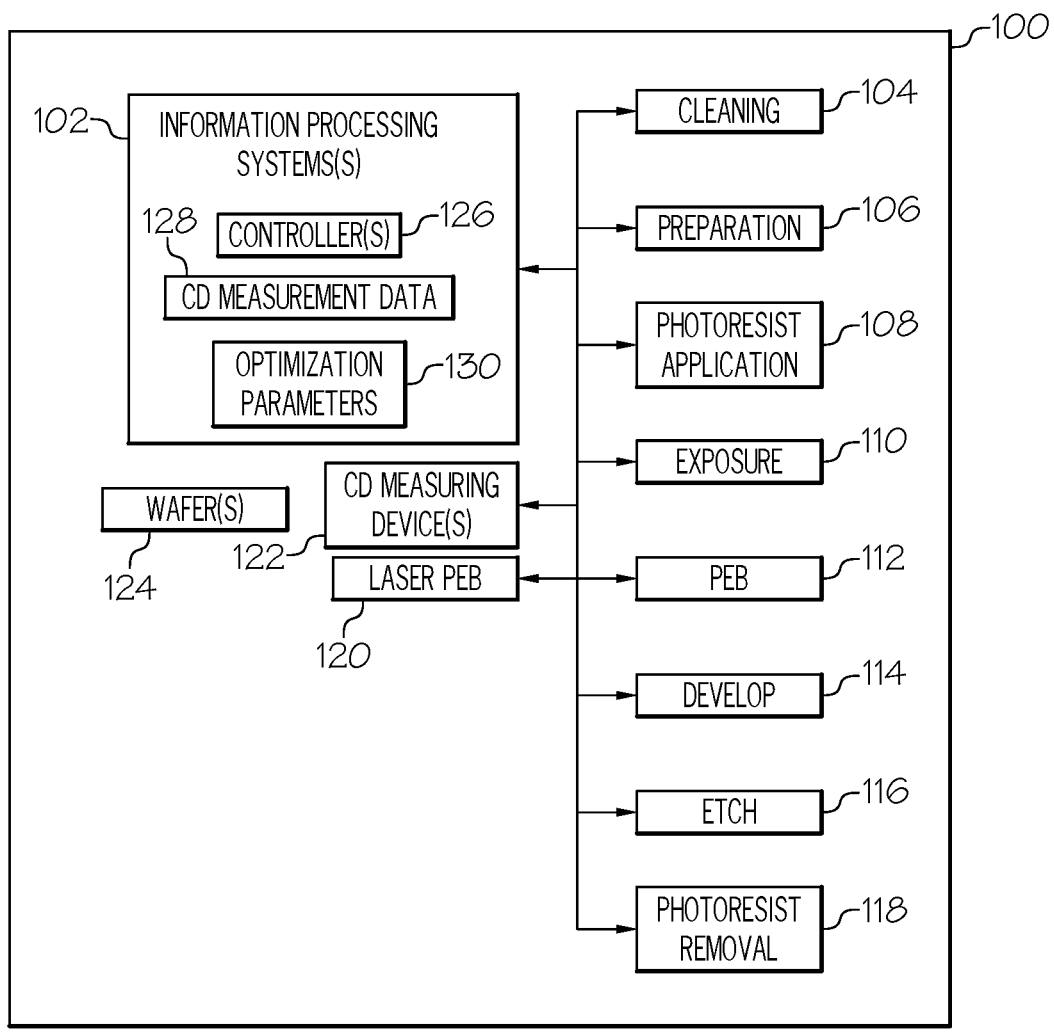
FIG. 1 is a block diagram illustrating a system for co-optimizing lithographic and etching processes for semiconductor fabrication according one embodiment of the present disclosure.

Referring now to the drawings in which like numerals represent the same of similar elements, FIG. 1 illustrates a block diagram of a lithography system/apparatus 100 according to one or more embodiments. In one embodiment, the lithography system 100 is a patterning system comprising one or more information processing systems 102, patterning stations/components 104 to 118, CD measuring devices 122, and semiconductor wafers 124. The information processing system 102 may control the one or more patterning stations and their components, and may further control the one or more critical dimension measuring devices 104. In one embodiment, the information processing system 102 comprises at least one controller 126, CD measurement data 128, and laser PEB optimization parameters/data 130. Each of these components is discussed in greater detail below. The CD measuring device(s) 122, in one embodiment, is any device capable of measuring dimensions of the patterns formed on the semiconductor wafer 124. One example of a CD measuring device 122 is a CD Scanning Electron Microscope.

The one or more patterning stations may include a cleaning station 104, a preparation station 106, a photoresist application station 108, an exposure station 110, a post exposure bake (PEB) station 112, a developing station 114, an etching station 116, a photoresist removal station 118, and a laser PEB station 120. In some embodiments, two or more of these stations are separate from each other where the semiconductor wafer 124 is moved from one station to a different station after processing. However, in other embodiments, two or more of these stations may be combined into a single station. In addition, one or more of the stations/components 104 to 120 may not be a physical station per se, but may refer to a patterning process(es) performed by the system 100.

In one embodiment, the cleaning station/process 104 removes contaminants from the surface of the semiconductor wafer 124 using, for example, a wet chemical treatment. The preparation station/process 106, in one embodiment, removes any unwanted moisture from the surface of the semiconductor wafer 124 and may apply an adhesion promoter to the surface of the semiconductor wafer 124. The photoresist application station/process 108, in one embodiment, forms a layer of photoresist material on the surface of semiconductor layer 122 (or the adhesion promoter layer if formed). A process such as, but not limited to, spin coating may be used to form the photoresist layer. This process may include direct application of the photoresist (PR) material or the use of more complex stacks such as trilayer (e.g., from bottom to top: OPL, SiARC/SiOx, PR). Excess photoresist solvent may be removed by pre-baking the coated semiconductor wafer 124.

The exposure station/process 110, in one embodiment, exposes the photoresist coated semiconductor wafer 124 to one or more patterns of light. The patterns may be formed by projecting the light through a mask. The bright parts of the image pattern cause chemical reactions, which result in one of the following situations depending on the type of resist material being used. Exposed positive-tone resist material becomes more soluble so that it may be dissolved in a developer liquid, and the dark portions of the image remain insoluble. Exposed negative-tone resist material becomes more soluble so that it may not be dissolved in a developer liquid, and the dark portions of the image remain soluble.

The PEB station/process 112, in one embodiment, subjects the semiconductor wafer 124 to heat for a given period of time after the exposure process. In some embodiments, the PEB performs and completes the exposure reaction. The PEB process may also reduce mechanical stress formed during the exposure process. In one embodiment, the PEB station/process 112 comprises a hot plate on which the semiconductor wafer 124 is placed. The hot plate applies heat across the entire semiconductor wafer 124. In at least some instances, heat may not be applied uniformly, and this non-uniform heat distribution results in CDU variation.

The develop station/process 114, in one embodiment, subjects the semiconductor wafer 124 to one or more develop solutions after the post exposure bake. The develop solution(s) dissolves away the exposed portions of the photoresist. After development, the remaining photoresist forms a stenciled pattern across the wafer surface, which accurately matches the desired mask pattern. The etch station/process 116, in one embodiment, subjects the semiconductor wafer 124 to wet or dry chemical agents to remove one or more layers of the wafer 124 not protected by the photoresist pattern. The photoresist removal station/process 118, in one embodiment, removes the remaining photoresist material after the etching process. The photoresist material may be removed by one or more processes such as (but not limited to) chemical stripping, ashing, etc.

The laser PEB station/process 120 provides an annealing process that is complimentary to the hot plate PEB annealing. As will be discussed in greater detail below, the laser PEB station/process 120 may utilize one or more lasers and focusing components to apply focused heat to a given area(s) of the semiconductor wafer 124. Examples of laser type implemented within the laser PEB station 120 include a carbon dioxide laser or a diode laser. The laser PEB station 120 may also comprise one or more optics that adjust the laser beam spot size. The complimentary annealing process provided by the laser PEB station/process 120 enables critical density uniformity to be achieved and edge placement errors to be avoided and/or corrected. For example, since laser PEB is complementary to the POR hot plate PEB, it introduces additional PEB treatment for photoresists in a precisely controlled fashion (PEB time, temperature, and location), to counteract other factors in the process flow that lead to CD non-uniformity. The semiconductor wafer 124 may be processed by the laser PEB station 120 before or after being processed by the hot plate PEB station 112. It should be noted that the lithography system 100 is not limited to the stations/processes discussed above. In some embodiments, one or more of the stations/processes 104 to 120 may be removed from the system 100 and/or additional stations/processes may be added.

Figure 2:
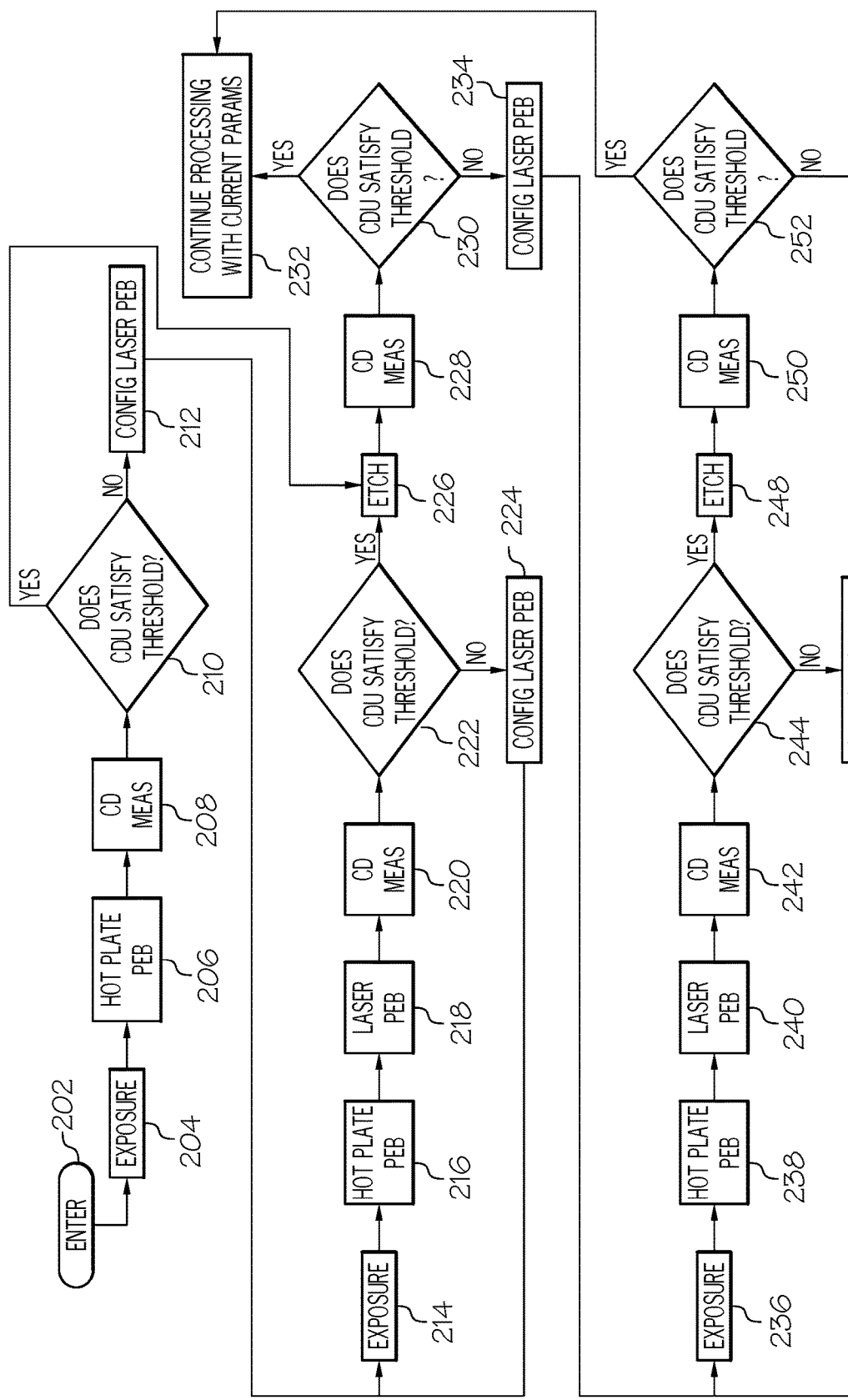
FIG. 2 is an operational flow diagram illustrating one example of a process for co-optimizing lithographic and etching processes for semiconductor fabrication according one embodiment of the present disclosure.

FIG. 2 is an operational flow diagram illustrating one example of a process for co-optimizing lithographic and etching process utilizing a complimentary laser-based post exposure bake. It should be noted, in some embodiments, the CD measurements discussed below may be taken repeatedly on each wafer at a number of selected locations/patterns for process development. The process flow of FIG. 2 begins a step 202, which is at a point in time after the semiconductor wafer 124 has been processed by the cleaning, preparation, and photoresist application stations 104 to 108. In other words, at step 202, the semiconductor wafer 124 comprises a photoresist material at this point in the fabrication process.

After the semiconductor wafer 124 has been coated with the photoresist material(s), the controller 126 of the information processing system 102 initiates the exposure station 110 and the wafer 124 is exposed to one or more patterns of light, at step 204. The exposed portions of the photoresist material on the wafer 124 undergo a chemical reaction and become more soluble (in the case of positive-tone photoresist) or more insoluble (in the case of negative-tone photoresist). The controller 126 then initiates the hot plate PEB station 112 where the hot plate applies a given amount of heat for a given period of time to the wafer 124, at step 206. This process completes the exposure reaction. The controller 126 then initiates the develop station 114 where the exposed portions of the photoresist material are removed (in the case of positive-tone photoresist) or remain (in the case of negative-tone photoresist). After the develop process, the photoresist material has been divided into multiple copies of patterned photoresist features.

In many instances, there will be variations in the critical dimensions of the patterned photoresist features. For example, intra-field or inter-field CD non-uniformity may result from (but not limited) hot plate fingerprint (hot plate PEB temperature non-uniformity), etch fingerprint (etch rate non-uniformity due to etch process), and other processes causing variation such as photoresist topography. Therefore, once the photoresist material has been patterned, the controller 126 initiates the CD measuring device 122 where CD measurements of a number of selected patterns are taken in multiple exposure fields across the wafer, at step 208. For example, the dimensions of the patterned photoresist features are measured and stored as CD measurement data 128 in one or more data storage devices. Location data of the features on the wafer 124 may also be stored as part of the CD measurement data 128. The controller 126 then compares these CD measurement data 128 to one or more CDU thresholds, at step 210. In one embodiment, the thresholds are ideal values for CDU across the wafer 124 (global), between fields (inter-field), and between features within a field (intra-field). The controller 126, based on the comparison, determines if the uniformity of the measured critical dimensions for the features across the wafer; across fields; and/or within one or more fields satisfies these thresholds. For example, the controller 126 determines the uniformity of the measured critical dimensions are within an acceptable range of the ideal CDU values.

If controller 126 determines the CDU of the patterned photoresist features satisfy the CDU threshold(s), control flow continues to step 226 (etch station/process). Stated differently, laser PEB is not configured and initiated. However, if the controller 126 determines the CDU of the patterned photoresist features does not satisfy the CDU threshold(s) the controller 126 configures the laser PEB station 120 with one or more optimization parameters 130 such as (but not limited to) location, laser PEB temperature, and laser PEB time. Location optimization parameters instruct the laser PEB station 120 where on the semiconductor wafer 124 to apply the laser beam. These parameters may instruct the laser PEB station 120 to apply the laser beam to the entire wafer 124, one or more fields within the wafer, or one or more photoresist features within a field based on locations on the wafer identified by the CD measurement process as having CDU variations outside of given threshold(s). The temperature parameters adjust the amount of heat applied by the lasers to the semiconductor wafer 124. In one embodiment, the amount of heat may be controlled by adjusting the energy output of the laser(s) and/or adjusting the amount of time the laser beam is focused on a given area. In some embodiments, the heat adjustment may be predetermined or may be adjusted at each iteration of the laser PEB process based on the CD measurement results of a prior iteration. The time parameters adjust the anneal time (beam dwell time).

After the laser PEB parameters have been configured, the process flows to step 214 where a new photoresist coated semiconductor wafer 124 is processed by the exposure and hotplate PEB stations 110, 112 similar to steps 204 and 206 discussed above. Then, the controller 126 initiates the laser PEB station 120 where laser annealing is performed on the patterned photoresist features according to the laser PEB optimization parameters 130. As discussed above, the laser annealing may be performed on the entire wafer 124, one or more fields within the wafer, or one or more photoresist features within a field depending on the CD measurements taken at step 208 and the optimization parameters used to configure the laser PEB station 120 at step 212. Since laser PEB is complementary to the POR hot plate PEB, it introduces additional PEB treatment for photoresists (providing heat for chemical reactions in photoresists) in a precisely controlled fashion (PEB time, temperature, and location), to counteract other factors in the process flow that lead to CD non-uniformity.

After the laser anneal process has been performed on the wafer 124, the controller 126 initiates the CD measuring device 122 where CD measurements of the wafer/fields are taken, at step 220. For example, the dimensions of the patterned photoresist features are measured and stored as CD measurement data 128 in one or more data storage devices. Location data of the features on the wafer 124 may also be stored as part of the CD measurement data 128. The controller 126, at step 222, then compares the post-laser PEB CD measurement data 128 to one or more CDU thresholds, at step 210. If the controller 126 determines the CDU of the (post-laser PEB) patterned photoresist features for the given area does not satisfy the CDU threshold(s), the controller, at step 224, adjusts the laser PEB station 120 based on the optimization parameters 130 and the control flow returns to step 214 where a new wafer 124 is processed.

If the controller 126 determines the new CDU measurements satisfy the CDU thresholds, the current laser PEB parameters are maintained and the control flows to step 226. The controller 126, at step 226, initiates the etch station 116 where the semiconductor wafer 124 is subjected to wet or dry chemical agents to remove one or more layers of the wafer 124 not protected by the patterned photoresist features. The controller 126, at step 228, initiates the CD measuring device 122 to perform post-etch CD measurements on the features created by the etching process which underlie the patterned resist features. Similar to the above, the post-etch CD measurements may be taken across the entire wafer 124, across given fields, and/or within given fields. For example, the dimensions of the post-etch pattern features are measured and stored as CD measurement data 128 in one or more data storage devices. Location data of the post-etch pattern features on the wafer 124 may also be stored as part of the CD measurement data 128.

The controller 126, at step 230, then compares the post-etch CD measurement data 128 to one or more CDU thresholds to determine if the CDU of the post-etch pattern features within an area of interest satisfies the thresholds. In some embodiments, the tolerance/threshold of CD non-uniformity may not necessarily the same for post-etch CD and post-litho CD. More post-litho CD variation may be tolerated to counteract any variation caused by etch. One of the goals is to achieve CD uniformity of post-etch patterns which appear on wafers rather than in an intermediate step (e.g. photoresist pattern). If the controller 126 determines the CDU of the post-etch pattern features for the given area satisfy the CDU threshold(s) the current laser PEB parameters are maintained for processing subsequent wafers, at step 232. However, if the controller 126 determines the CDU of the post-etch pattern features do not satisfy the CDU threshold(s) the controller 126, at step 234, further adjusts the laser PEB 120 based on one or more of the optimization parameters 130. For example, the controller 126 further adjusts the temperature applied by the laser PEB 120 to the wafer 124, the duration (dwell time) of time the laser is applied to the wafer 124, and/or the location on the wafer 124 where the laser is applied.

After the post-etch optimization of the laser PEB parameters have been configured, the process flows to step 236 where a new semiconductor wafer 124 is processed by the exposure station 110 similar to step 214. Processing of the wafer 124 continues through steps 238 to 252 where the hot plate PEB station 112, develop station 114, laser PEB station 120, CD measurement device 122, etch station 116 each perform operation similar to those discussed above. However, it should be noted that the laser PEB station 120 processes the wafer 124 at step 240 according to the post-etch optimization parameters determined at step 234. The operations performed at steps 236 to 252 are repeated until the post-etch CDU measurements taken at step 250 satisfy the CDU thresholds at step 252. Once this occurs, the current parameters of the laser PEB 120 are maintained and the control flow returns to step 232 where subsequent wafers are processed using the current laser PEB parameters.

It should be noted that, in some embodiments, one or more of the laser PEB process steps 218, 240 may be performed prior to the hot plate PEB processing steps 216, 238. For example, after the exposure process has been performed at step 214 the laser process 218 may be performed. The hot plate PEB process flow 216 would then be performed after the laser process flow 218 has completed. A similar configuration may be applied to the post-etch optimization flow represented by steps 236 to 252. Also, in one process iteration the laser process flow may be performed prior to the hot plate process and then in a subsequent process iteration the laser process flow may be performed subsequent to the hot plate process flow.

The laser PEB discussed above is advantageous over conventional lithographic optimization methods because it is capable of co-optimizing both lithographic and etching processes with minimum change to POR process flows. The laser PEB process of one or more embodiments utilizes localized heating by laser annealing to complement POR (process of record) hot plate PEB to achieve global and local CDU on wafers. Embodiments of the present may be easily incorporated into current process flows due to no extra time or resources on high-cost (exposure) tools and no need to re-configure current tools for advanced optimization capabilities. Laser PEB provides precise control of PEB temperature, duration, and location, and thus allows for countering different global and local effects. Also, the heat treatment area provided by the laser PEB of one or more embodiments may range from laser beam spot size (on the order of laser wavelength) to whole wafer (by scanning laser beam in an overlapping approach).

Figure 3:
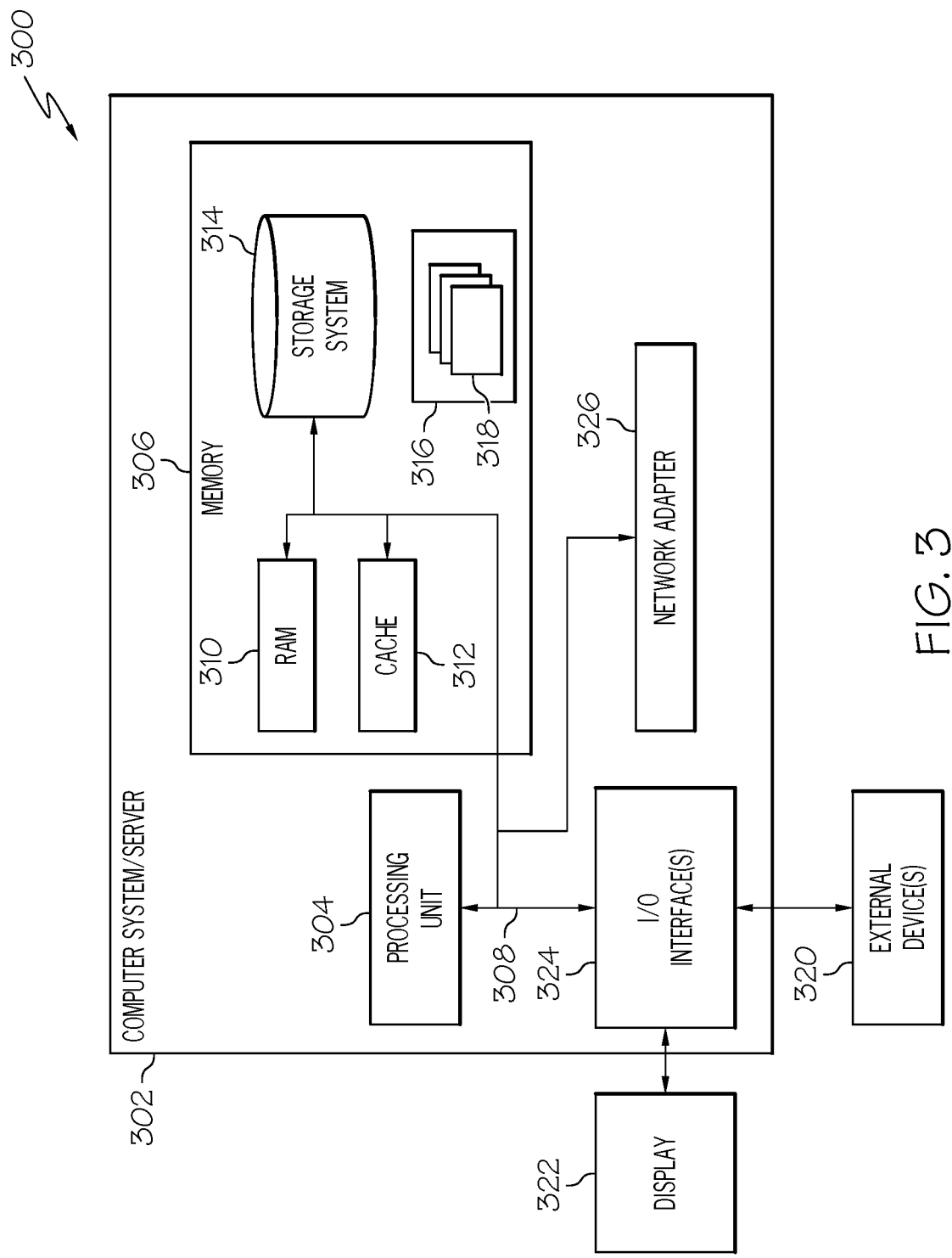
FIG. 3 is a block diagram illustrating one example of an information processing system according to one embodiment of the present disclosure.

Referring now to FIG. 3, this figure is a block diagram illustrating an information processing system that can be utilized in embodiments of the present disclosure. The information processing system 302 is based upon a suitably configured processing system configured to implement one or more embodiments of the present disclosure such as the information processing system 102 of FIG. 1.

Any suitably configured processing system can be used as the information processing system 302 in embodiments of the present disclosure. The components of the information processing system 302 can include, but are not limited to, one or more processors or processing units 304, a system memory 306, and a bus 308 that couples various system components including the system memory 306 to the processor 304. The bus 308 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Although not shown in FIG. 3, the main memory 306 includes the controller 126, CD measurement data 128, and laser PEB optimization parameters/data 130. The controller 126 may reside within the processor 1004, or be a separate hardware component. The system memory 306 may also include computer system readable media in the form of volatile memory, such as random access memory (RAM) 310 and/or cache memory 312. The information processing system 302 can further include other removable/non-removable, volatile/non-volatile computer system storage media. By way of example only, a storage system 314 may be provided for reading from and writing to a non-removable or removable, non-volatile media such as one or more solid state disks and/or magnetic media (typically called a "hard drive"). A magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to the bus 308 by one or more data media interfaces. The memory 306 may include at least one program product having a set of program modules that are configured to carry out the functions of an embodiment of the present disclosure.

Program/utility 316, having a set of program modules 318, may be stored in memory 1006 by way of example, and not limitation, as well as an operating system, one or more application programs, other program modules, and program data. Each of the operating system, one or more application programs, other program modules, and program data or some combination thereof, may include an implementation of a networking environment. Program modules 318 generally carry out the functions and/or methodologies of embodiments of the present disclosure.

The information processing system 302 may also communicate with one or more external devices 320 such as a keyboard, a pointing device, a display 322, etc.; one or more devices that enable a user to interact with the information processing system 302; and/or any devices (e.g., network card, modem, etc.) that enable computer system/server 302 to communicate with one or more other computing devices. Such communication can occur via I/O interfaces 324. Still yet, the information processing system 302 can communicate with one or more networks such as a local area network (LAN), a general wide area network (WAN), and/or a public network (e.g., the Internet) via network adapter 326. As depicted, the network adapter 326 communicates with the other components of information processing system 302 via the bus 308. Other hardware and/or software components can also be used in conjunction with the information processing system 302. Examples include, but are not limited to: microcode, device drivers, redundant processing units, external disk drive arrays, RAID systems, tape drives, and data archival storage systems.

The description of the present disclosure has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated. The terminology used herein is for the purpose of describing particular embodiments only and is not intended to be limiting of the invention.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

As will be appreciated by one skilled in the art, aspects of the present disclosure may be embodied as a system, method, or computer program product. Accordingly, various aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system". Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present disclosure may be written in any combination of one or more programming languages, including an object oriented programming language such as Java, Python, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present disclosure have been discussed above with reference to flowchart illustrations and/or block diagrams of methods, apparatus (systems) and computer program products according to various embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof.

Although specific embodiments have been disclosed, those having ordinary skill in the art will understand that changes can be made to the specific embodiments without departing from the spirit and scope of the disclosure. The scope of the disclosure is not to be restricted, therefore, to the specific embodiments, and it is intended that the appended claims cover any and all such applications, modifications, and embodiments within the scope of the present disclosure.

It should be noted that some features of the present disclosure may be used in one embodiment thereof without use of other features of the present disclosure. As such, the foregoing description should be considered as merely illustrative of the principles, teachings, examples, and exemplary embodiments of the present disclosure, and not a limitation thereof.

Also note that these embodiments are only examples of the many advantageous uses of the innovative teachings herein. In general, statements made in the specification of the present application do not necessarily limit any of the various claimed disclosures. Moreover, some statements may apply to some inventive features but not to others.

What is claimed is:

1. A method of co-optimizing lithographic and etching processes for semiconductor fabrication, the method comprising:
    determining a first set of locations for a first complementary laser annealing to be performed on at least a first semiconductor wafer of a plurality of semiconductor wafers;
    after a first post-exposure baking process has been performed on at least the first semiconductor wafer, performing the first complementary laser annealing at the first set of locations on at least the first semiconductor wafer;
    after an etching process has been performed on at least the first semiconductor wafer, determining a second set of locations for a second complementary laser annealing to be performed on at least a second semiconductor wafer of the plurality of semiconductor wafers; and
    after a second post-exposure baking process has been performed on at least the second semiconductor wafer, performing the second complementary laser annealing at the second set of locations on at least the second semiconductor wafer.

2. The method of claim 1, wherein determining the first set of locations and performing the first complementary laser annealing are iteratively performed until a uniformity of critical dimension for features within one or more given areas of at least one semiconductor wafer of the plurality of semiconductor wafers satisfies at least a first uniformity of critical dimension threshold, and
    wherein determining the second set of locations and performing the second complementary laser annealing are iteratively performed after the at least first uniformity of critical dimension threshold has been satisfied and until a uniformity of critical dimension for features within one or more given areas of at least one semiconductor wafer of the plurality of semiconductor wafers satisfies at least a second uniformity of critical dimension threshold.

3. The method of claim 1, wherein determining the first set of locations comprises:
    analyzing uniformity of critical dimension for features within a given area of at least a third semiconductor wafer of the plurality of semiconductor wafers after a third post-exposure baking process and prior to an etching process;
    determining that the uniformity of critical dimension for the features fails to satisfy one or more uniformity of critical dimension thresholds; and
    selecting the first set of locations from the given area.

4. The method of claim 3, wherein the given area comprises:
    the third semiconductor as a whole;
    a plurality of fields within at least the third semiconductor wafer; or
    a single a field within at least the third semiconductor wafer.

5. The method of claim 3, wherein performing the first complementary laser annealing at the first set of locations of the at least second semiconductor wafer comprises:
    adjusting one or more operating parameters of the first complementary laser annealing based on determining the uniformity of critical dimension for the features fails to satisfy the one or more uniformity of critical dimension thresholds.

6. The method of claim 1, wherein determining the second set of locations comprises:
    analyzing uniformity of critical dimension for features within a given area of at least the first semiconductor wafer after the etching process;
    determining that the uniformity of critical dimension for the features fails to satisfy one or more uniformity of critical dimension thresholds; and
    selecting the second set of locations from the given area.

7. The method of claim 6, wherein the given area comprises:
    an entirety of at least the first semiconductor as a whole;
    a plurality of fields within at least the first semiconductor wafer; or
    a single a field within at least the first semiconductor wafer.

8. The method of claim 6, wherein performing the second complementary laser annealing at the second set of locations of the second semiconductor wafer comprises:
    adjusting one or more operating parameters of the second complementary laser annealing based on determining the uniformity of critical dimension for the features fails to satisfy the one or more uniformity of critical dimension thresholds.

9. A method of co-optimizing lithographic and etching processes for semiconductor fabrication, the method comprising:

determining a first set of locations for first complementary laser annealing to be performed on at least a first semiconductor wafer of a plurality of semiconductor wafers;

prior to a first post-exposure baking process being performed on at least the first semiconductor wafer, performing the first complementary laser annealing at the first set of locations on at least the first semiconductor wafer;

after an etching process has been performed on at least the first semiconductor wafer, determining, a second set of locations for a second complementary laser annealing to be performed on at least a second semiconductor wafer of the plurality of semiconductor wafers; and prior to a second post-exposure baking process being performed on at least the second semiconductor wafer, performing the second complementary laser annealing at the second set of locations on at least the second semiconductor wafer.

10. The method of claim 9, wherein determining the first set of locations and performing the first complementary laser annealing are iteratively performed until a uniformity of critical dimension for features within one or more given areas of at least one semiconductor wafer of the plurality of semiconductor wafers satisfies at least a first uniformity of critical dimension threshold, and wherein determining the second set of locations and performing the second complementary laser annealing are iteratively performed after the at least first uniformity of critical dimension threshold has been satisfied and until a uniformity of critical dimension for features within one or more given areas of at least one semiconductor wafer of the plurality of semiconductor wafers satisfies at least a second uniformity of critical dimension threshold.

11. The method of claim 10, wherein determining the first set of locations comprises:

analyzing uniformity of critical dimension for features within a given area of at least a third semiconductor wafer after a third post-exposure baking process and prior to an etching process;

determining that the uniformity of critical dimension for the features fails to satisfy one or more uniformity of critical dimension thresholds; and selecting the first set of locations from the given area.

12. The method of claim 11, wherein the given area comprises:

an entirety at least the third semiconductor as a whole;
a plurality of fields within at least the third semiconductor wafer; or
a single a field within at least the third semiconductor wafer.

13. The method of claim 11, wherein performing the first complementary laser annealing at the first set of locations of at least the second semiconductor wafer comprises:

adjusting one or more operating parameters of the first complementary laser annealing based on determining the uniformity of critical dimension for the features fails to satisfy the one or more uniformity of critical dimension thresholds.

14. The method of claim 10, wherein determining the second set of locations comprises:

analyzing uniformity of critical dimension for features within a given area of at least the first semiconductor wafer after the etching process;

determining that the uniformity of critical dimension for the features fails to satisfy one or more uniformity of critical dimension thresholds; and selecting the second set of locations from the given area.

15. The method of claim 14, wherein the uniformity of critical dimension is analyzed for at least one of:

at least the first semiconductor wafer as a whole;
between two or more fields of at least the first; or
between features within a field of at least the first semiconductor wafer.

16. The method of claim 14, wherein performing the second complementary laser annealing at the second set of locations of at least the second semiconductor wafer comprises:

adjusting one or more operating parameters of the complementary laser annealing based on determining the uniformity of critical dimension for the features fails to satisfy the one or more uniformity of critical dimension thresholds.

17. A system for co-optimizing lithographic and etching processes for semiconductor fabrication, the system comprising:

memory;
one or more processors; and
at least one controller configured to perform a method comprising
determining a first set of locations for a first complementary laser annealing to be performed on at least a first semiconductor wafer of a plurality of semiconductor wafers;
performing the first complementary laser annealing at the first set of locations on at least the first semiconductor wafer, wherein the first complementary laser annealing is performed one of before or after a first post-exposure baking process for at least the first semiconductor wafer;
after an etching process has been performed on at least the first semiconductor wafer, determining, a second set of locations for a second complementary laser annealing to be performed on at least a second semiconductor wafer of the plurality of semiconductor wafers; and
performing the second complementary laser annealing at the second set of locations on at least the second semiconductor wafer, wherein the second complementary laser annealing is performed one of before or after a second post-exposure baking process for at least the second semiconductor wafer.

18. The system of claim 17, wherein determining the first set of locations and performing the first complementary laser annealing are iteratively performed until a uniformity of critical dimension for features within one or more given areas of at least one semiconductor wafer of the plurality of semiconductor wafers satisfies at least a first uniformity of critical dimension threshold, and wherein determining the second set of locations and performing the second complementary laser annealing are iteratively performed after the at least first uniformity of critical dimension threshold has been satisfied and until a uniformity of critical dimension for features within one or more given areas of at least one semiconductor wafer of the plurality of semiconductor wafers satisfies at least a second uniformity of critical dimension threshold.

19. The system of claim 17, wherein determining the first set of locations comprises:
   analyzing uniformity of critical dimension for features within a given area of at least a third semiconductor wafer of the plurality of semiconductor layers after a third post-exposure baking process and prior to an etching process;
   determining that the uniformity of critical dimension for the features fails to satisfy one or more uniformity of critical dimension thresholds; and
   selecting the first set of locations from the given area.

20. The system of claim 17, wherein determining the second set of locations comprises:
   analyzing uniformity of critical dimension for features within a given area of the at least the first semiconductor wafer after the etching process;
   determining that the uniformity of critical dimension for the features fails to satisfy one or more uniformity of critical dimension thresholds; and
   selecting the second set of locations from the given area.

\* \* \* \* \*